(12) United States Patent
Yamasaki

(10) Patent No.: US 11,799,265 B2
(45) Date of Patent: Oct. 24, 2023

(54) LIGHT-EMITTING MODULE

(71) Applicant: Murata Manufacturing Co., Ltd., Nagaokakyo (JP)

(72) Inventor: Tsutomu Yamasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 299 days.

(21) Appl. No.: 16/906,290

(22) Filed: Jun. 19, 2020

(65) Prior Publication Data

US 2020/0321750 A1 Oct. 8, 2020

Related U.S. Application Data

(63) Continuation of application No. PCT/JP2018/038790, filed on Oct. 18, 2018.

(30) Foreign Application Priority Data

Feb. 20, 2018 (JP) .................. 2018-028055

(51) Int. Cl.
| | |
|---|---|
| *H01S 5/02251* | (2021.01) |
| *G02B 6/02* | (2006.01) |
| *G02B 6/26* | (2006.01) |
| *H01S 5/42* | (2006.01) |
| *G02B 6/42* | (2006.01) |
| *H01S 5/02234* | (2021.01) |

(52) U.S. Cl.
CPC ...... *H01S 5/02251* (2021.01); *G02B 6/02038* (2013.01); *G02B 6/262* (2013.01); *G02B 6/4203* (2013.01); *H01S 5/423* (2013.01); *H01S 5/02234* (2021.01)

(58) Field of Classification Search
None
See application file for complete search history.

(56) References Cited

U.S. PATENT DOCUMENTS

| | | | |
|---|---|---|---|
| 4,701,011 A | 10/1987 | Emkey et al. | |
| 5,450,157 A * | 9/1995 | Rees ................... | G02B 3/0087 355/1 |

(Continued)

FOREIGN PATENT DOCUMENTS

| | | |
|---|---|---|
| JP | 62-501732 A | 7/1987 |
| JP | 2006-522364 A | 9/2006 |

(Continued)

OTHER PUBLICATIONS

Official Communication issued in International Patent Application No. PCT/JP2018/038790, dated Jan. 8, 2019.

*Primary Examiner* — Rhonda S Peace
(74) *Attorney, Agent, or Firm* — KEATING & BENNETT, LLP

(57) ABSTRACT

A light-emitting module includes a substrate, a surface light-emitting element, and an optical waveguide. The surface light-emitting element includes light sources and is attached to the substrate. The optical waveguide is attached to the surface light-emitting element in a state in which the optical waveguide covers the light sources. The optical waveguide extends in an axial direction with a refractive index distribution in a radial direction. The optical waveguide condenses light beams emitted from the surface light-emitting element.

13 Claims, 2 Drawing Sheets

(56) References Cited

U.S. PATENT DOCUMENTS

| | | | |
|---|---|---|---|
| 6,195,485 B1 * | 2/2001 | Coldren | H01S 5/423 385/49 |
| 6,870,195 B2 * | 3/2005 | Lemoff | H01S 5/423 257/79 |
| 7,039,075 B2 * | 5/2006 | Thornton | H01S 5/18305 372/75 |
| 7,939,791 B1 * | 5/2011 | Stone | G02B 6/4249 385/33 |
| 8,085,472 B2 * | 12/2011 | Kadar-Kallen | G02B 6/32 359/652 |
| 2002/0151941 A1 * | 10/2002 | Okawa | A61B 90/30 607/99 |
| 2003/0185269 A1 | 10/2003 | Gutin | |
| 2004/0165845 A1 | 8/2004 | Lemoff et al. | |
| 2004/0190851 A1 | 9/2004 | Garner et al. | |
| 2004/0256630 A1 * | 12/2004 | Cao | F21V 29/70 257/E25.02 |
| 2005/0069257 A1 | 3/2005 | Bhagavatula et al. | |
| 2007/0201805 A1 * | 8/2007 | Hamada | G02B 6/29361 385/131 |
| 2011/0096404 A1 * | 4/2011 | Kadar-Kallen | G02B 6/4206 359/653 |
| 2011/0110390 A1 | 5/2011 | Willing et al. | |
| 2013/0255613 A1 | 10/2013 | Hartke et al. | |
| 2020/0321750 A1 * | 10/2020 | Yamasaki | H01S 5/423 |
| 2022/0178798 A1 * | 6/2022 | Iida | G01N 1/10 |

FOREIGN PATENT DOCUMENTS

| | | |
|---|---|---|
| JP | 2007-507007 A | 3/2007 |
| JP | 2011-101003 A | 5/2011 |
| JP | 2013-545280 A | 12/2013 |
| JP | 2014-192166 A | 10/2014 |

* cited by examiner

LIGHT-EMITTING MODULE

CROSS REFERENCE TO RELATED APPLICATIONS

This application claims the benefit of priority to Japanese Patent Application No. 2018-028055 filed on Feb. 20, 2018 and is a Continuation Application of PCT Application No. PCT/JP2018/038790 filed on Oct. 18, 2018. The entire contents of each application are hereby incorporated herein by reference.

BACKGROUND OF THE INVENTION

1. Field of the Invention

The present invention relates to a light-emitting module that emits light.

2. Description of the Related Art

Japanese Unexamined Patent Application Publication (Translation of PCT Application) No. 2007-507007 describes a fiber lens that includes a multimode pigtail fiber and a refractive lens. The fiber lens can condense light from light sources, such as laser diodes, by using the refractive lens to form a focused spot and enables efficient optical coupling.

The fiber lens described in Japanese Unexamined Patent Application Publication (Translation of PCT Application) No. 2007-507007 connects the refractive lens and the multimode pigtail fiber to each other. However, the refractive lens has to be formed in, for example, a hyperbolic or near-hyperbolic shape and the manufacturing cost thus tends to increase. In addition, the refractive lens and the multimode pigtail fiber have to be positioned with sufficiently high accuracy, and therefore it is difficult to connect them to each other. Furthermore, the fiber lens described in Japanese Unexamined Patent Application Publication (Translation of PCT Application) No. 2007-507007 causes light to enter a refractive lens or a GRIN lens by using the multimode pigtail fiber. Accordingly, the overall size of the fiber lens tends to be large when compared to directly causing light to enter a lens.

SUMMARY OF THE INVENTION

Preferred embodiments of the present invention provide light-emitting modules that are each able to be small in size and that each output light at a high intensity.

A light-emitting module according to a preferred embodiment of the present invention includes a substrate, a surface light-emitting element that is provided on the substrate and includes a plurality of light sources, and an optical waveguide that covers the plurality of light sources and is attached to the surface light-emitting element, that has a refractive index distribution in a radial direction, and that extends in an axial direction. The optical waveguide condenses light beams emitted from the surface light-emitting element.

According to preferred embodiments of the present invention, light-emitting modules are each able to be compact and are each able to output light at a high intensity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Light-emitting modules according to preferred embodiments of the present invention are explained in detail below with reference to the accompanying drawings.

Figure 1:
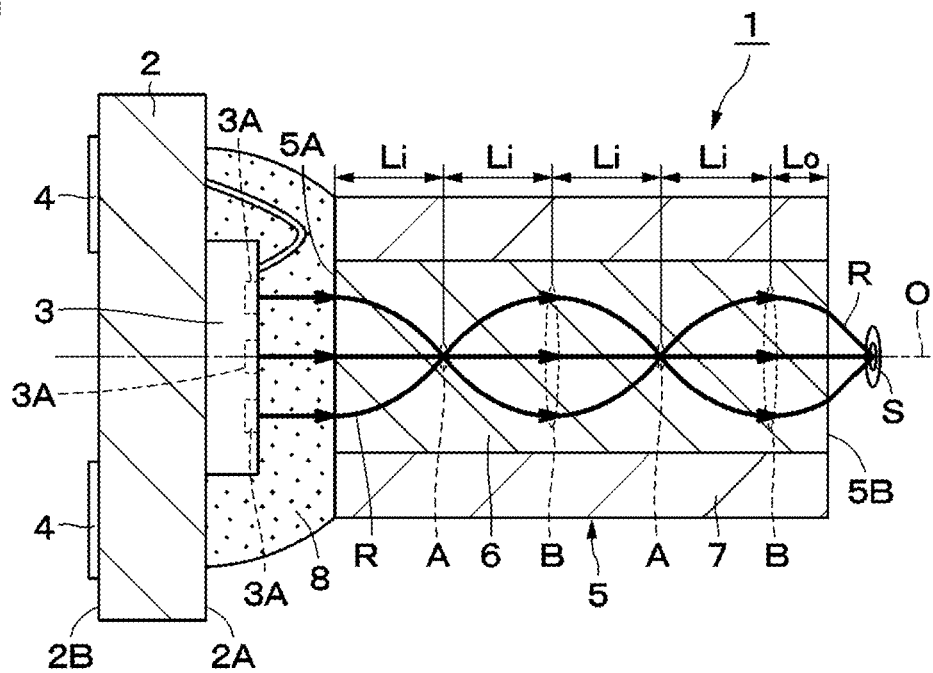
FIG. 1 is a sectional view showing a light-emitting module according to a first preferred embodiment of the present invention.
Figure 2:
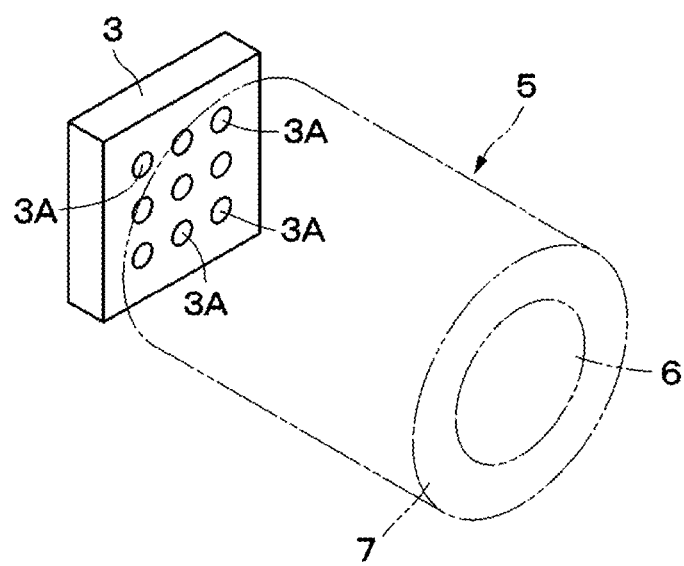
FIG. 2 is a perspective view showing a surface light-emitting element.

FIG. 1 and FIG. 2 show a light-emitting module 1 according to a first preferred embodiment of the present invention. The light-emitting module 1 includes a substrate 2, a surface light-emitting element 3, and an optical waveguide 5.

The substrate 2 is a flat or substantially flat plate that includes an insulating material. The substrate 2 may be, for example, a printed wire substrate or a ceramic substrate. The substrate 2 may be a multilayer substrate that includes a plurality of electrode layers and insulating layers alternately stacked. The front surface 2A (a first main surface) of the substrate 2 includes a surface light-emitting element 3 mounted thereon. The rear surface 2B (a second main surface) of the substrate 2 includes an electrode 4 provided thereon. The electrode 4 is electrically connected to the surface light-emitting element 3. Accordingly, the surface light-emitting element 3 receives an external drive current via the electrode 4.

The surface light-emitting element 3 is preferably defined by, for example, a vertical-cavity surface-emitting laser (VCSEL). The surface light-emitting element 3 includes a plurality of (for example, nine) light sources 3A (light-emitting portions). The light sources 3A are positioned on the front surface of the surface light-emitting element 3 and are provided in an array that includes, for example, three columns and three rows. The light sources 3A emit light together. The light sources 3A emit near-infrared light of about 850 nm, for example. The light sources 3A output light (light beams R) that propagates in the thickness direction of the surface light-emitting element 3. The surface light-emitting element 3 is attached to the front surface 2A of the substrate 2 by, for example, a bonding method such as wire bonding. The number of the light sources 3A that the surface light-emitting element 3 includes is not limited to nine and may be from two to eight or ten or more. The light sources 3A are able to output light of other wavelengths.

The optical waveguide 5 includes a refractive index distribution fiber. The optical waveguide 5 includes an optical fiber that includes a resin material and that includes a core 6 having a refractive index distribution structure. The optical waveguide 5 may include a material other than resin, for example, glass.

The optical waveguide 5 includes the core 6 that has a high refractive index and a cladding 7 that has a low refractive index. The optical waveguide 5 has a columnar or substantially columnar shape. The core 6 has a columnar or substantially columnar shape and is positioned at the axis center of the optical waveguide 5. The cladding 7 has a cylindrical or substantially cylindrical shape, is positioned on the outer side portion in the radial direction of the core 6, and covers the outer peripheral surface of the core 6.

The optical waveguide 5 has a refractive index distribution in the radial direction and extends in the axial direction along or substantially along the center axis O. Specifically, the refractive index of the core 6 of the optical waveguide 5 is highest at the center position in the radial direction and gradually decreases (for example, compared to the square of the radius) toward the outer side portion in the radial direction. When the light beams R enter in the axial direction to the position of the center axis O, the light beams R propagate straight along the center axis O inside the optical waveguide 5. On the other hand, when the light beams R enter in the axial direction to a position that deviates from the center axis O, the light beams R meander by successively decreasing and increasing their distance to the center axis O inside the optical waveguide 5 and propagate. Accordingly, the optical waveguide 5 repeatedly condenses and diffuses light and propagates the light from an incident end 5A to an emitting end 5B.

The optical waveguide 5 preferably has a length of, for example, about 2 mm to about 4 mm in the axial direction. The optical waveguide 5 includes a node A where light beams R converge and an antinode B where light beams R diverge. The node A and the antinode B are alternately provided in the axial direction. An interval size Li between the node A and the antinode B is determined by, for example, the refractive index distribution within the core 6 and the wavelength of the propagated light. The emitting end 5B of the optical waveguide 5 is a flat or substantially flat surface that is perpendicular or substantially perpendicular to the axial direction of the optical waveguide 5. The emitting end 5B of the optical waveguide 5 is not limited to being a flat or substantially flat surface and may be, for example, a semi-spherical or substantially semi-spherical surface that protrudes toward the outer portion, in the emitting direction.

The emitting end 5B of the optical waveguide 5 is located at a position that protrudes by a predetermined protrusion amount Lo from the proximal antinode B. That is, the emitting end 5B of the optical waveguide 5 is located at a position between the antinode B and the node A. The protrusion amount Lo is preferably, for example, larger than one-third of the interval size Li and smaller than the interval size Li (Li/3<Lo<Li). As a result, the light that propagates through the optical waveguide 5 is emitted from the emitting end 5B in a state in which the light tends to converge. Accordingly, the light emitted from the emitting end 5B is condensed on the periphery of the light emitting end 5B and forms a spot S.

The optical waveguide 5 is attached to the surface light-emitting element 3 by an adhering portion 8 that is preferably made of, for example, a transparent adhesive. The core 6 is large enough to cover all of the light sources 3A of the surface light-emitting element 3. Accordingly, light (light beams R) emitted from all of the light sources 3A of the surface light-emitting element is incident on the core 6. As long as it is within the range of the light (light beams R) from all of the light sources 3A that are emitted by the surface light-emitting element 3 being incident, there is no need to strictly position the center of the core 6 to align with the center of the surface light-emitting element 3.

The light-emitting module 1 according to the first preferred embodiment of the present invention includes the foregoing features and elements, and operation of the light-emitting module 1 is explained next.

First, upon supplying a drive current to the surface light-emitting diode 3 through the electrode 4, the plurality of light sources 3A of the surface light-emitting element 3 emit light. The light sources 3A output the light beams R in the thickness direction of the substrate 2. The output surface (front surface) of the surface light-emitting element 3 is covered by the optical waveguide 5. Accordingly, the light beams R from all of the light sources 3A are incident on the core 6 of the optical waveguide 5. The light beams R that enter the incident end 5A of the optical waveguide 5 repeatedly converge and diverge inside the optical waveguide 5, and propagate in the axial direction of the optical wave guide 5. The light propagated in the optical waveguide 5 is emitted from the emitting end 5B in a state in which the light tends to converge. As a result, light outputted from the plurality of light sources 3A of the surface light-emitting element 3 converges on the periphery of the emitting end 5B of the optical waveguide 5 and forms the spot S.

Thus, in the light-emitting module 1 according to the first preferred embodiment, the optical waveguide 5 condenses light beams R emitted from the surface light-emitting element 3. As a result, the optical waveguide 5 is able to output light at a high intensity, since the optical waveguide 5 condenses light beams R, which are emitted from the plurality of light sources 3A of the surface light-emitting element 3. In addition, the light-emitting module 1 is able to be small in size, since there is no need to use a multimode pigtail as in the related art and the surface light-emitting element 3 is simply attached to the incident end 5A of the optical waveguide 5.

In addition, the optical waveguide 5 includes an optical fiber that is made of a resin material and that includes the core 6 having a refractive index distribution structure. Accordingly, the optical waveguide 5 is able to be configured while being matched with the size of the surface light-emitting element 3, since the degree of freedom of the refractive index distribution is able to be increased.

Furthermore, the emitting end 5B of the optical waveguide 5 is located at a position that protrudes by the predetermined protrusion amount Lo from the proximal antinode B. The protrusion amount Lo is preferably, for example, larger than one-third of the interval size Li between the antinode B and the node A and smaller than the interval size Li (Li/3<Lo<Li). As a result, the light that propagates through the optical waveguide 5 is emitted from the emitting end 5B in a state in which the light tends to converge. Accordingly, the light emitted from the emitting end 5B is condensed on the periphery of the light emitting end 5B and forms the spot S.

Figure 3:
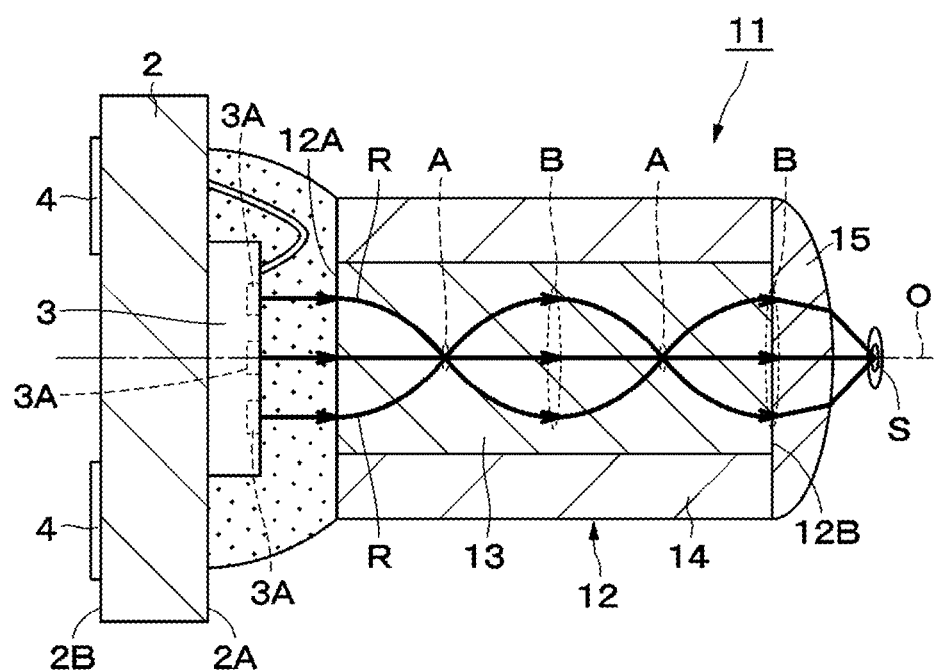
FIG. 3 is a sectional view showing a light-emitting module according to a second preferred embodiment of the present invention.

A second preferred embodiment of the present invention is shown in FIG. 3. The characteristics of the second preferred embodiment are such that the optical waveguide includes a lens positioned at the emitting end from which the light beams are emitted. In the second preferred embodiment, the same or similar features and elements as those in the first preferred embodiment have the same reference numerals and their explanation is not repeated.

Similarly to the first preferred embodiment, a light-emitting module 11 according to the second preferred embodiment includes the substrate 2, the surface light-emitting element 3, and an optical waveguide 12. The optical waveguide 12 is similar to the optical waveguide 5 of the first preferred embodiment. Accordingly, the optical waveguide 12 includes a core 13 and a cladding 14, similar to the core 6 and the cladding 7 of the first preferred embodiment. The surface light-emitting element 3 is attached to an incident end 12A of the optical guide 12 by the adhering portion 8.

A lens 15 is attached to an emitting end 12B of the optical waveguide 12. The emitting end 12B of the optical waveguide 12 does not have to be at a position between the antinode B and the node A of the optical waveguide 12 and may be positioned at the antinode B of the optical waveguide 12. The lens 15 preferably has, for example, a semi-spherical or semi-spherical shape that protrudes toward an exterior of the light-emitting module, in the emitting direction. A dissolved resin material is adhered to the emitting end 12B of the optical waveguide 12, and the lens 15 is defined by the surface tension of the resin material. Afterwards, by the resin material solidifying, the lens 15 is fixed to the optical waveguide 12. The lens 15 is not limited to being defined by surface tension and, for example, is able to be provided by a separate included convex lens that is adhered to the emitting end 12B of the optical waveguide 12 or by including a ball lens attached with, for example, tools to the emitting end 12B of the optical waveguide 12.

Thus, the second preferred embodiment described above has the same or approximately the same advantageous operations and effects as the first preferred embodiment. Also, the optical waveguide 12 includes the lens 15 positioned at the emitting end 12B of the light beams R. Accordingly, the lens 15 is able to condense the light beams R emitted from the plurality of light sources 3A of the surface light-emitting element 3. As a result, the light is able to be condensed until the diffraction limit.

The specific numerical values described in each of the preferred embodiments are merely examples and the preferred embodiments are not limited to such numerical values. Such numerical values are appropriately set according to, for example, the specifications of the applicable subject.

The foregoing preferred embodiments are examples, and partial replacements and combinations of features and elements of different preferred embodiments are possible.

The light-emitting modules of preferred embodiments of the present invention each include a substrate, a surface light-emitting element having an array configuration that is provided on the substrate and includes a plurality of light sources, and an optical waveguide that covers the plurality of light sources and is attached to the surface light-emitting element, that has a refractive index distribution in the radial direction, and that extends in the axial direction. The optical waveguide condenses light beams emitted from the surface light-emitting element.

From the foregoing, the optical waveguide is able to output light at a high intensity by condensing light beams emitted from a plurality of light sources of the surface light-emitting element. There is no need to use a connector since the surface light-emitting element alone has to be attached to the incident end of the optical waveguide into which light enters, and therefore, the light-emitting module is able to be small in size.

In preferred embodiments of the present invention, the optical waveguide includes a lens that is positioned at the emitting end from which the light beams are emitted. Accordingly, the light beams that are emitted from the plurality of light sources of the surface light-emitting element are able to be condensed by the lens. As a result, the light is able to be condensed until the diffraction limit.

In preferred embodiments of the present invention, the optical waveguide includes an optical fiber that is made of a resin material and that includes a core having a refractive index distribution structure. Accordingly, the optical waveguide may have the same or substantially the same size of the surface light-emitting element since the degree of freedom of the refractive index distribution is able to be increased.

In preferred embodiments of the present invention, a protrusion amount Lo is a value that satisfies the relationship of $Li/3 < Lo < Li$, where Li is the size of the interval between an antinode where light beams diverge and a node where the light beams converge, and Lo is the protrusion amount from the proximal antinode to the emitting end of the optical waveguide. Accordingly, light that propagates through the optical waveguide is emitted from the emitting end in a state where the light tends to converge. As a result, the light emitted from the emitting end converges on the outer periphery of the emitting end and forms a spot.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A light-emitting module comprising:
a substrate;
a surface light-emitting element provided on the substrate and including a plurality of light sources; and
an optical waveguide covering the plurality of light sources and attached to the surface light-emitting element, that has a refractive index distribution in a radial direction, and that extends in an axial direction; wherein
the optical waveguide condenses light beams emitted from the plurality of light sources of surface light-emitting element;
the optical waveguide has the refractive index distribution in the radial direction such that the refractive index of the optical waveguide is highest at a center position of the optical waveguide in the radial direction and gradually decreases toward an outer side portion of the optical waveguide in the radial direction; and
the optical waveguide includes a node where the light beams emitted from the plurality of light sources converge and an antinode where the light beams emitted from the plurality of light sources diverge, and the node and the antinode are alternately provided in the axial direction.

2. The light-emitting module according to claim 1, wherein the optical waveguide includes a lens positioned at an emitting end of the light-emitting module from which the light beams are emitted.

3. The light-emitting module according to claim 1, wherein the optical waveguide includes an optical fiber that is made of a resin material and that includes a core having a refractive index distribution structure.

4. The light-emitting module according to claim 3, wherein the optical waveguide further includes a cladding that has a refractive index lower than a refractive index of the core.

5. The light-emitting module according to claim 1, wherein a protrusion amount Lo has a value that satisfies a relationship of $Li/3 < Lo < Li$, where Li is a size of an interval between the antinode where light beams diverge and the node where the light beams converge, and Lo is a protrusion amount from a proximal antinode to the emitting end of the optical waveguide.

6. The light-emitting module according to claim 1, wherein the plurality of light sources of the surface light-emitting element are arranged in an array.

7. The light-emitting module according to claim 1, wherein the substrate is a flat or substantially flat plate that includes an insulating material.

8. The light-emitting module according to claim 1, wherein
- the surface light-emitting element is provided on a first main surface of the substrate;
- an electrode is provided on a second main surface of the substrate; and
- the electrode is electrically connected to the surface light-emitting element.

9. The light-emitting module according to claim 1, wherein the surface light-emitting element is a vertical-cavity surface-emitting laser (VCSEL).

10. The light-emitting module according to claim 1, wherein at least one of the plurality of light sources emits near-infrared light.

11. The light-emitting module according to claim 1, wherein the optical waveguide has a length of about 2 mm to about 4 mm in the axial direction.

12. The light-emitting module according to claim 1, wherein the emitting end of the optical waveguide is a flat or substantially flat surface that is perpendicular or substantially perpendicular to the axial direction.

13. The light-emitting module according to claim 1, wherein the optical waveguide is attached to the surface light-emitting element by an adhering portion.

* * * * *